United States Patent
Lin

(10) Patent No.: US 6,486,939 B2
(45) Date of Patent: Nov. 26, 2002

(54) ELECTRONICALLY CONTROLLED UNIVERSAL PHASE-SHIFTING MASK FOR STEPPER EXPOSURE SYSTEM

(75) Inventor: John Chin-Hsiang Lin, Kaohsung (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/850,637

(22) Filed: May 7, 2001

(65) Prior Publication Data

US 2001/0033996 A1 Oct. 25, 2001

Related U.S. Application Data

(62) Division of application No. 09/174,617, filed on Oct. 19, 1998, now Pat. No. 6,261,728.

(51) Int. Cl.[7] .................. G03B 27/42; G03B 27/52; G01N 21/86
(52) U.S. Cl. .................. 355/53; 250/548; 355/55
(58) Field of Search .................. 355/53, 68, 71, 355/55; 430/5, 22, 30, 311; 250/492.2, 548

(56) References Cited

U.S. PATENT DOCUMENTS

| | | | |
|---|---|---|---|
| 5,527,645 A | * | 6/1996 | Pati et al. .................. 430/5 |
| 5,539,568 A | * | 7/1996 | Lin et al. .................. 359/285 |
| 5,600,485 A | | 2/1997 | Iwaki et al. .................. 359/561 |
| 5,614,937 A | | 3/1997 | Nelson .................. 347/240 |
| 5,617,203 A | * | 4/1997 | Kobayashi et al. .................. 356/237 |
| 5,724,447 A | | 3/1998 | Fukushima .................. 382/211 |
| 5,998,069 A | * | 12/1999 | Cutter et al. .................. 430/5 |
| 6,121,626 A | * | 9/2000 | Lin .................. 250/548 |
| 6,292,251 B1 | * | 9/2001 | Holley et al. .................. 355/32 |

OTHER PUBLICATIONS

Paufler et al., "High–Throughput Optical Direct Write Lithography", Solid State Technology (Jun. 1997), pp. 175–176, 178, 180, 182.
Levenson et al., "Improving Resolution in Photolithograph with a Phase–Shifting Mask", IEEE Transactions on Electr. Devices, vol. ED–29. No. 12, (Dec. 1982), pp. 1828–1836.
Levenson, "Phase–Shifting Mask Strategies: Isolated Dark Lines", Microlithography World, (Mar./Apr.), pp. 6–12.

* cited by examiner

*Primary Examiner*—Alan A. Mathews
(74) *Attorney, Agent, or Firm*—George O. Saile; Stephen B. Ackerman

(57) ABSTRACT

A dynamic mask exposure system includes a support, a source of a beam, and a transmissive dynamic phase-shifting mask with orthogonally arranged matrices of actuator lines and binary pixel units which are opaque or transparent as a function of control inputs to the actuator lines. A control system is connected to supply pixel control signals to the actuator lines of the mask to form a pattern of transparent regions and opaque regions. The beam is directed onto the mask. A pattern detection element is located on the support. The beam passes through the transparent regions and projects a pattern from the mask onto the support or onto the image detection element. Where the image detection element is the target, there are means for providing signals representing the pattern to the control system.

32 Claims, 5 Drawing Sheets

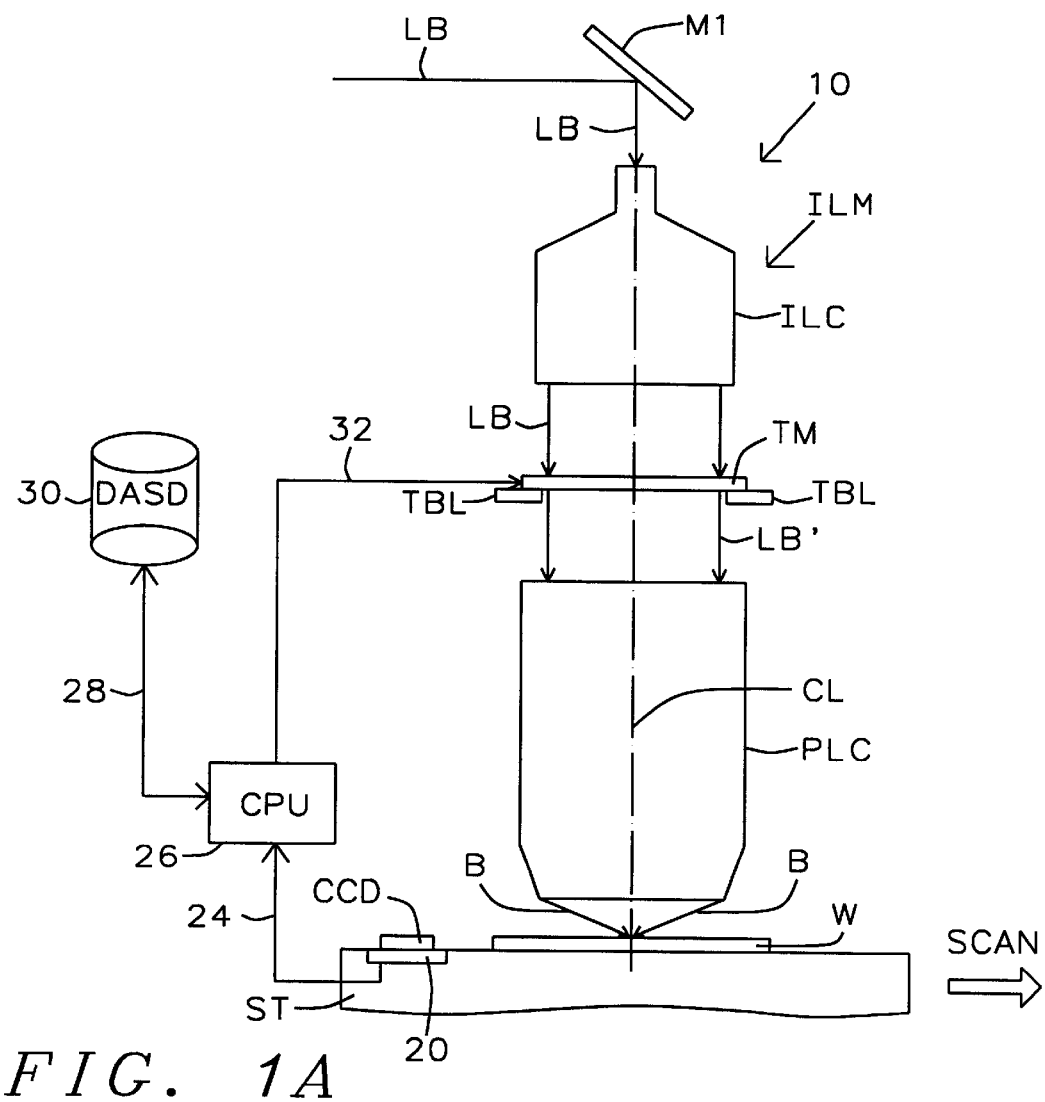
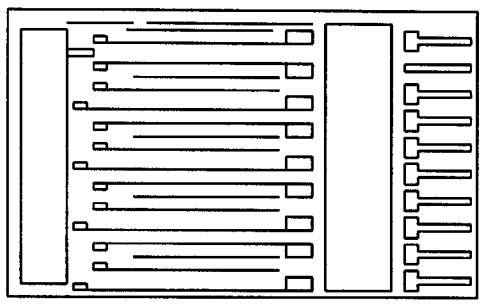
FIG. 1B
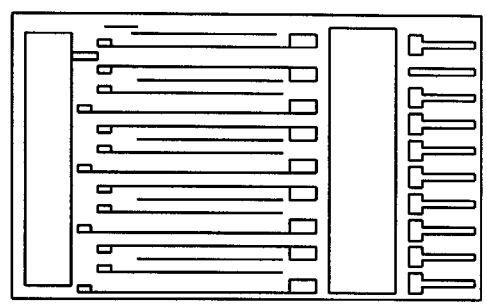
FIG. 1C

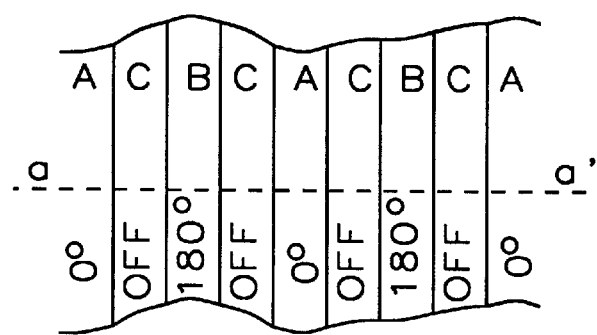
*FIG. 4*
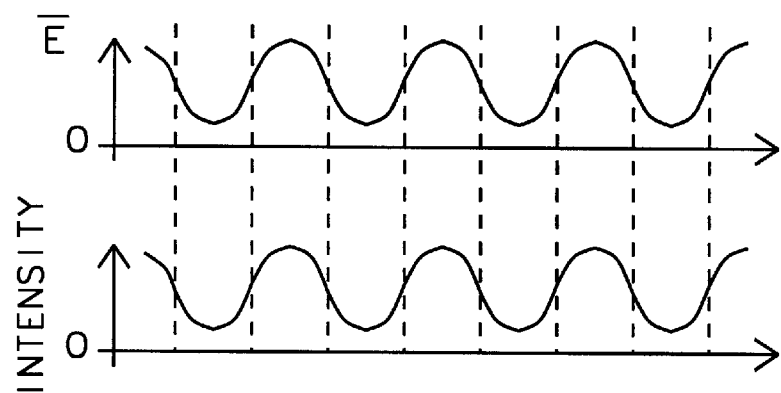
*FIG. 5 — Prior Art*
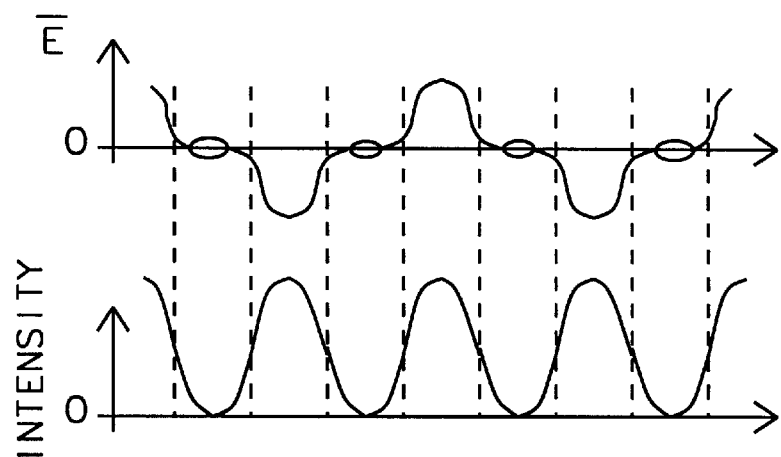
*FIG. 6*

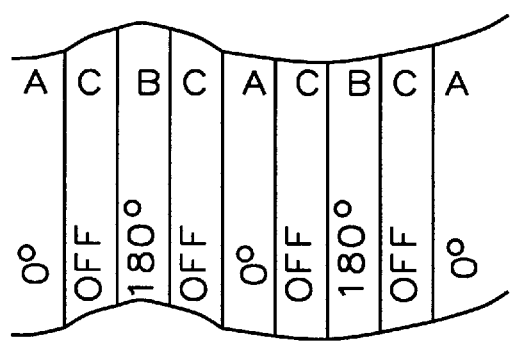
FIG. 7
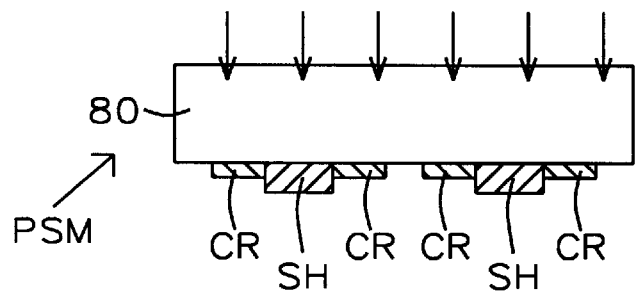
FIG. 8A – Prior Art
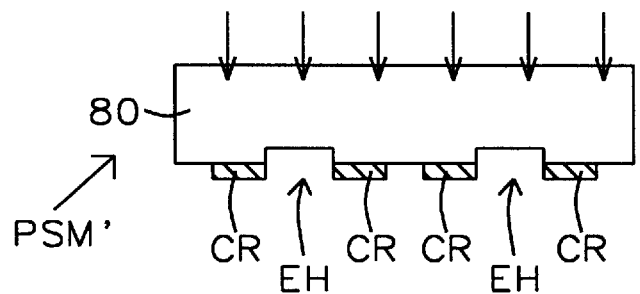
FIG. 8B – Prior Art

ELECTRONICALLY CONTROLLED UNIVERSAL PHASE-SHIFTING MASK FOR STEPPER EXPOSURE SYSTEM

CROSS-REFERENCE TO RELATED APPLICATIONS

This application is a divisional of application Ser. No. 09/174,617 filed Oct. 19, 1998, now U.S. Pat. No. 6,261,728.

BACKGROUND OF THE INVENTION

1. Field of the Invention

This invention relates to masks for semiconductor manufacturing and more particularly to phase-shifting masks.

2. Description of Related Art

This invention teaches an electronically controlled universal phase-shift mask in a stepper exposure system. The pixel dynamic mask e.g., a SLM (Spatial Light Modulator) can be controlled to have phase-shift features.

Pfauler et al. "High-Throughput Optical Direct Write Lithography", Solid State Technology (June 1997), pp. 175–176, 178, 180, 182 describes a direct write lithography system using a programmable phase-modulated spatial light modulator (SLM) system in which the image is reflected from the SLM onto a semiconductor wafer. The spatial light modulator comprises an array of rectangular electrodes with a reflective, deformable viscoelastic layer on top. The SLM serves as a plane mirror in an optical system.

U.S. Pat. No. 5,641,937 of Nelson for "Method for High Resolution Printing" shows an SLM in a printing system.

U.S. Pat. No. 5,600,485 of Iwaki et al. for "Optical Pattern Recognition System and Method of Ferroelectric Liquid Crystal Spatial Light Modulator" shows a pattern recognition system using a SLM (spatial light modulator).

U.S. Pat. No. 5,724,447 of Fukushima for "Optical Transform System for Three-Dimensional Object Recognition" shows an image detection system for phase-shift masks using an SLM and a CCD.

Levenson et al "Improving Resolution in Photolithography with a Phase-Shifting Mask", IEEE Transactions on Electron Devices, VOL. ED-29. No. 12, (Dec. 1982), pp. 1828–1836.

Levenson "Phase-Shifting Mask Strategies: Isolated Dark Lines", Microlithograpy World, (March/April 1992) pp. 6–12).

SUMMARY OF THE INVENTION

A problem with the prior art is that it is necessary to prepare entire sets of various layer masks for a single device. With a conventional binary mask the resolution is limited at the near exposure wavelength which is a disadvantage.

In accordance with a first aspect of this invention, a dynamic mask exposure system and method employs a support for a workpiece, a source of a beam of exposure radiation, a transmissive dynamic mask with matrices of actuator lines arranged orthogonally and binary pixel units which are opaque or transparent as a function of control inputs to the actuator lines, the transmissive dynamic mask has a top surface and a bottom surface. A control system is connected to supply pixel control signals to the actuator lines of the transmissive dynamic phase-shifting mask to form a pattern of transparent regions and opaque regions. The beam is directed down onto the top surface of the mask. The beam which passes through the transparent regions projects a pattern from the mask onto the support where the workpiece is to be located. Preferably the control system comprises a computer and a direct access storage device for storing patterning data; the transmissive dynamic mask comprises a transmissive spatial light modulator; the source of the beam of exposure radiation comprises a collimated light beam, preferably provided by at least one condenser lens projecting the collimated light beam onto the top surface of the mask. A projection lens system projects and focuses the pattern from the mask onto the support from the bottom surface of the mask.

In accordance with another aspect of this invention, a dynamic mask exposure system and method employs a support for a workpiece and a source of a beam of exposure radiation. A transmissive dynamic phase-shifting mask with orthogonally arranged matrices of actuator lines and binary pixel units which are opaque or transparent as a function of control inputs to the actuator lines, the transmissive dynamic mask having a top surface and a bottom surface is employed. A control system is connected to supply pixel control signals to the actuator lines of the transmissive dynamic mask to form a pattern of transparent regions and opaque regions. The beam is directed down onto the top surface of the mask. An image detection element for detecting a pattern of radiation projected thereon is located on the top surface of the support. The beam passes through the transparent regions and projects a pattern from the mask onto the support where the image detection element is to be located. Means for providing signals represent the pattern to the control system. The source of the beam of exposure radiation comprises a collimated light beam provided by at least one condenser lens projecting the collimated light beam onto the top surface of the mask. Preferably the control system comprises a computer and a direct access storage device for storing patterning data; the transmissive dynamic mask comprises a transmissive spatial light modulator; and a projection lens system projects and focuses the pattern from the mask onto the support from the bottom surface of the mask.

BRIEF DESCRIPTION OF THE DRAWINGS

The foregoing and other aspects and advantages of this invention are explained and described below with reference to the accompanying drawings, in which:

FIG. 1A shows a schematic elevational section of a system for exposing a workpiece with a computer controlled pattern of light projected through a transmissive universal dynamic mask in accordance with this invention.

FIG. 1B shows a plan view of a pattern provided to transmissive universal dynamic mask in FIG. 1A in response to signals provided by a computer system.

FIG. 1C shows a plan view of a pattern provided by a CCD sensor in response to the image detected from the beam projected on the CCD with the patterns provided thereto by transmissive universal dynamic mask, providing feedback data to the control computer.

FIG. 4 shows a chart for a phase-shifting mask with A: 0°, B: 180°, and C: OFF states of operation.

FIG. 5 shows graphs of E-bar and Intensity for the mask of FIG. 4 for a conventional, prior art binary mask which produces low contrast since intensity is too high when the mask is in the OFF state and is positive for either the A: 0° or B: 180° states of operation.

FIG. 6 shows graphs of E-bar and Intensity for the mask of FIG. 4 for a phase-shifting mask in accordance with this invention which produces good contrast since intensity is nearly zero when the mask is in the OFF state, is positive for the A: 0° state of operation and negative for the B: 180° state of operation. As can be seen the intensity is nearly zero in the OFF stage C.

FIG. 7 shows a chart for another phase-shifting mask with A: 0°, B: 180°, and C: OFF states of operation associated with the conventional phase-shift masks in FIGS. 8A and 8B.

FIG. 8A shows a prior art phase-shift mask composed of a quartz substrate with phase-shifters between chromium conductors.

FIG. 8B shows a modified prior art phase-shift mask composed of a quartz substrate with phase etching into the quartz between the chromium conductors.

DESCRIPTION OF THE PREFERRED EMBODIMENT

FIG. 1A shows a stepper exposure system 10 with a computer controlled, electronic, transmissive Spatial Light Modulator (SLM) mask TM with a pixel matrix which is operated by use of phase information. The pixel units of the SLM mask TM can be switched ON and OFF to form a semiconductor circuit pattern on the matrix of the SLM mask TM. The pixels can also contain phase information which is controlled by computer processors such a 0° phase passes through the SLM mask TM or a 180° phase passes through the SLM mask TM. There can be segmentation to include phases 0°/60°/120°/180° and variable values. The SLM mask TM can work as a phase-shifting mask to enhance the depth of focus of semiconductor circuit printing.

FIG. 1A shows a schematic elevational section of a system 10 for exposing a workpiece with a pattern of light projected through a transmissive universal dynamic mask SLM TM in accordance with this invention. FIG 1A is a schematic elevational section of a system 10 taken along the x (horizontal from left to right) and z (vertical) axes (in an x, y, z coordinate system) of an exposure system 10 in accordance with this invention. A transmissive universal dynamic SLM mask TM is supported in a fixed position on table TBL. The system 10 exposes a workpiece W supported by a stage ST with light projected through the SLM mask TM. The SLM mask TM is energized by x, y, matrices as illustrated by FIG. 2 which is a plan view of the SLM mask TM and the control system including computer 26 which energizes the pixel elements of the SLM mask TM. Thus workpiece W is exposed to a pattern provided by SLM mask TM under control of computer 26. The electronically controlled dynamic SLM mask TM of FIG. 2 with its pixel matrix can control both intensity and "phase." A pixel unit can show an intensity value of "0" or "1" with a phase of 0° or 180°. While SLM devices such as SLM mask TM can be used either for intensity applications or for phase applications, here they are used for both.

Figure 1D:
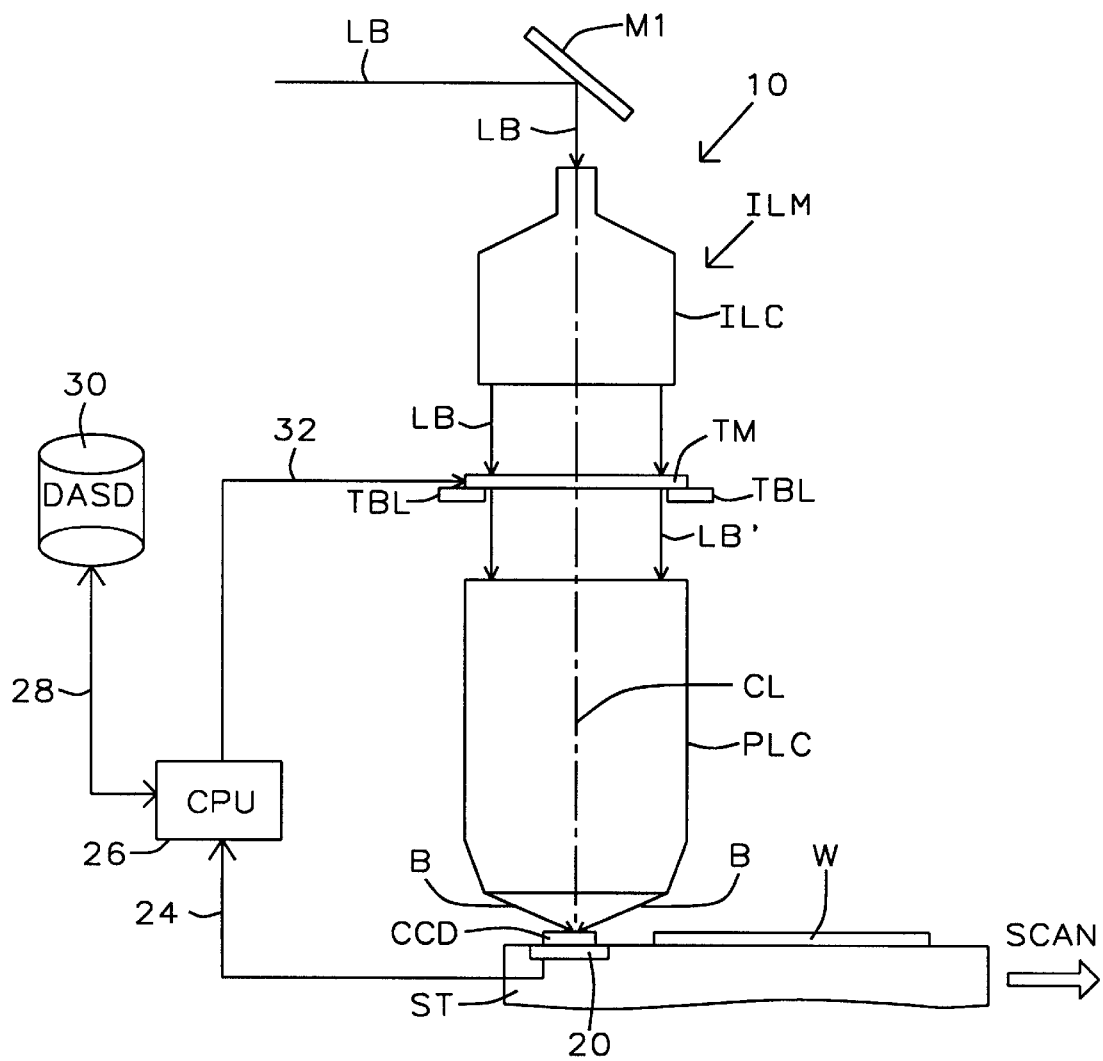
FIG. 1D shows how system performance is monitored by use of feedback from a charge coupled device image sensor which supplies the detected image data from the beam.
Figure 2:
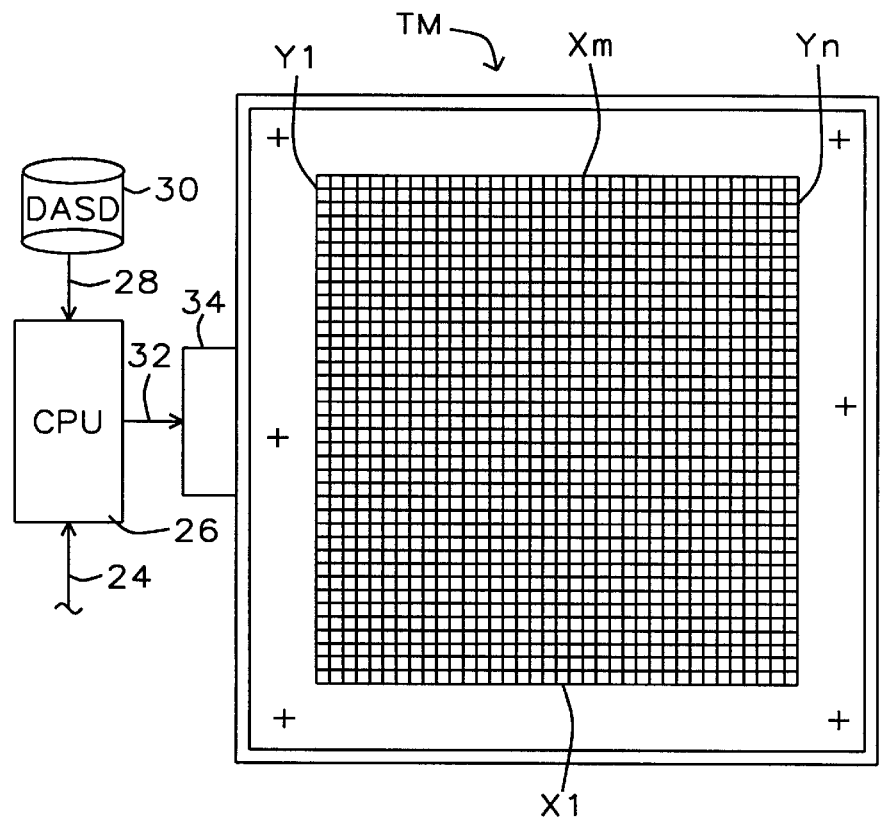
FIG. 2 shows a plan view of the transmissive universal dynamic mask TM shown in consisting of a x, y matrix array of small pixels which preferably comprises a spatial light modulator (SLM).

FIG. 1D shows how performance of the system 10 is monitored by use of feedback from a charge coupled device (CCD) image sensor 20 which supplies the detected image data from the beam B. The CCD image sensor 20 is located on the surface of the stage ST aside from the workpiece W. In the past CCD devices have been used for steppers for alignment, but in the present invention, he CCD device is used for feedback to improve the image quality of the image projected onto the CCD.

FIG. 2 shows a plan view of the transmissive universal dynamic mask TM shown in consisting of an x, y matrix array of small pixels which preferably comprises a spatial light modulator (SLM). Every pixel can be switched ON/OFF ("0"/"1") by a Central Processing Unit (CPU) of computer 26 to form a designed device pattern from a computer data base stored on data storage device 30 such as a disk drive or other Direct Access Storage Device (DASD). The computer 26 is connected by conventional interconnection block 34 to the mask TM which comprises an array of actuator lines extending along rectilinear x and y coordinate axes. The x lines X1 to Xm extend horizontally parallel to the x axis and the y lines Y1 to Yn extend vertically parallel to the y axis, where "m" and "n" are positive integers equal to the number of parallel actuator lines in the array with m horizontal lines X1 . . . Xm and n vertical lines Y1 . . . Yn.

FIG. 1B shows a plan view of a pattern provided to transmissive universal dynamic mask TM in FIG. 1A in response to signals provided by computer 26 from data in DASD 30, as will be explained in more detail below.

FIG. 1C shows a plan view of a pattern provided by the CCD 20 in response to the image detected from the beam B projected on CCD 20 with the patterns provided thereto by transmissive universal dynamic mask TM. The CCD 20 provides feedback data to computer 26 as will be explained in more detail below. Ideally, the view seen in FIG. 1B should be identical to the view seen in FIG. 1C but a difference is very likely to occur since the view seen in FIG. 1B is the view of the image from the DASD 30 which is sent through computer 16 on lines 32 to the mask TM.

On the other hand, the view seen in FIG. 1C is the pattern detected by the CCD device 20 when the beam B is hitting the CCD device 20 as shown in FIG. 1D where the stage has moved far to the right side of the system 10 providing the ideal identical pattern shown in FIG. 1C.

A beam LB from a light source (e.g. a laser beam G.I. 248.193 nm, not shown) is directed at a mirror M1 which reflects the beam LB from a light source down along a path parallel to the vertical z axis into an illuminator lens module ILM to a first condenser lens L1, which passes the light of beam LB into an illumination lens column ILC in module ILM. Illumination lens column ILC directs light rays in beam LB towards mask TM through which a portion LB' of the beam LB passes in accordance with the pattern of the mask TM. Beam LB floods the upper surface of the mask TM which is supported in a fixed position on table TBL. Table TBL has a hollow opening below the central patterning portion of mask TM through which the beam LB' passes.

The workpiece W preferably comprises a silicon semiconductor wafer coated with a photoresist layer which is to be exposed to a pattern comprising the image projected through mask TM. That pattern is projected as a collimated beam LB through the currently transparent portions of the mask TM. Thus, portions of the collimated beam LB pass through the mask TM, where the mask TM is transmissive, (not where it is opaque) thereby projecting an image defined by mask TM and patterned in light beam LB' onto workpiece W.

Transmissive universal dynamic mask TM preferably comprises a transmissive Spatial Light Modulator (SLM) with an array of pixels each of which is opaque or transparent respectively in accordance with the x, y matrix binary signals provided from CPU 26 on line 32 to the mask TM. The CPU 26 controls every pixel to be "ON" or "OFF".

Every pixel of the matrix of mask TM is switched ON (light: "1") or OFF (dark: "0") in response to signals on x and y matrix lines. The binary ON/OFF ("1"/"0") signals provide transmissive or opaque regions in the matrix through which beam LB is projected using a transmissive universal dynamic mask TM formed for example by a Spatial Light Modulator (SLM).

A circuit layout made by a designer and stored in disk drive storage device 30 is transferred from computer (CPU) 26 into the control lines 34 of the transmissive universal dynamic SLM mask TM by appropriately turning the pixels "ON" and/or "OFF" in the appropriate locations to form each pattern desired as a function of time as different workpieces are loaded on the stage ST.

As stated above, patterning images provided by the transmissive mask TM are generated under control of a computer CPU 26 which energizes elements of the transmissive universal dynamic mask TM. Computer CPU 26 receives x, Y matrix patterning data on line 28 from direct access storage device (DASD) 30, such as a disk drive, where the pattern data is stored. The CPU 26 also sends data on line 28 for storage in DASD 30, as is well understood by those skilled in the art.

After the light beam LB is projected through mask TM where it is converted into beam LB', beam LB' passes through projection lens column PLC to expose workpiece W projecting the patterning images received in the beam B from the transmissive mask TM onto the work W.

In other words the patterning images comprise portions of beam LB which pass through the mask TM as beam LB' and which then pass down through the projection lens column PLC which receives the beam LB' after it passes through the mask TM. The projection lens column PLC projects beam LB' to expose the surface of the workpiece W with the pattern projected from the mask TM above to expose the photoresist PR upon the surface of the workpiece W with the pattern projected from the mask TM.

A CCD imager on wafer stage responds to the exposed pattern transferred from the mask/projection lens. The charge coupled device CCD produces an image which is transmitted into the CPU 26 (computer) and compared to the designed pattern in the data base stored in the data storage device 30. These CCD image results are analyzed to optimize and modify the pattern on mask TM. The CCD imager also assists the optimizations of focus, dose, Numerical Aperture and partial coherence setting.

FIG. 2 shows a transmissive universal dynamic mask TM which has a range from about 0.1 to about $3\mu$→from about 50% to about 95% light transmission.

When a different layer is exposed, it is not necessary to reload the mask TM mechanically, only load the device/layer file through the CPU to the mask TM.

The whole device uses the same physical mask TM (fixed pixel) and there is no mechanical movement of the mask TM, which will improve the overlay (layer to layer) dramatically.

This significantly reduces the mask set required.

| DATA BASE | |
|---|---|
| Device A | Device B |
| Layer 1 | Layer 1 |
| Layer 2 | Layer 2 |
| Layer 3 | Layer 3 |
| Layer 4 | Layer 4 |

Figure 3:
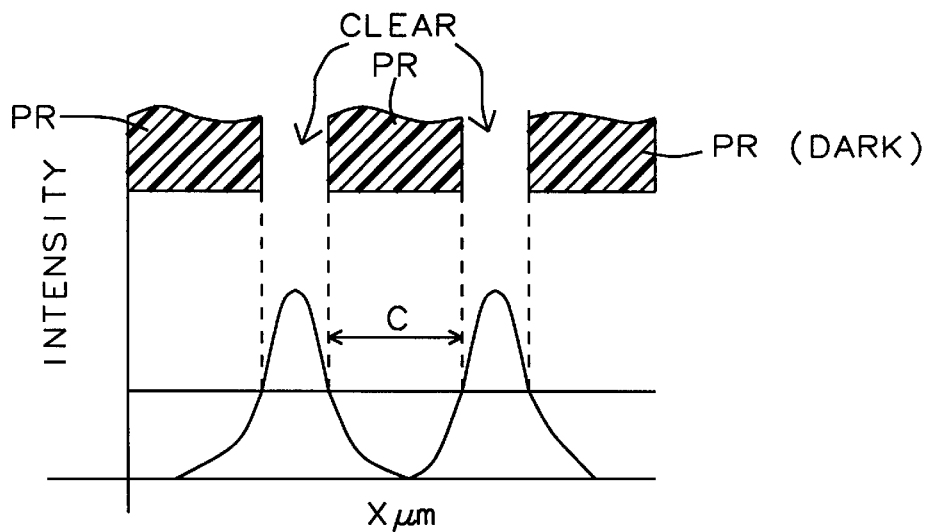
FIG. 3 which shows a graph for a CCD aerial image of Intensity as a function of distance x in micrometers.

1. A CCD image (aerial image) is compared to real processed wafer CD to calibrate the CCD image Critical Dimension (CD), to fix the threshold of the aerial image as shown in FIG. 3 which shows a graph for the CCD aerial image of Intensity as a function of distance x in micrometers. "C" is the desired pattern CD on wafers. The intensity threshold is determined by experimental data.
2. Then the CCD image of the CD will also be compared to the data-Base patterns to determine the CD variations and distortion on the CCD image.
3. Then the system in computer 26 corrects the CD and distortion on the dynamic mask TM.
4. Using this CCD image, one can set criteria to determine an optimum focus of the lens module and optimum stage levelling of the exposure tool ET of FIG. 1.
5. One can also change the focus and exposure dose, then check the CCD image/data-Base pattern mapping result, followed by feeding back to the CPU to determine the best NA (Numerical Aperture) and partial coherence of lens parameters to give the best setting for obtaining the largest depth of focus and energy latitude.
6. The phase-shifting mask will greatly enhance the resolution and depth of focus of the system.

In summary, the invention teaches a mask system comprising (a) a transmissive universal dynamic mask TM (e.g., A Spatial Light Modulator (SLM) assembly—and (b) a CCD image feed back to a computer.

FIG. 4 shows a chart for a phase-shifting mask with A: 0°, B: 180°, and C: OFF states of operation which applies to the present invention as well as the prior art showing the result of what control of a plurality of pixels can produce in the way of phase-shifting to 0° or 180° or the OFF state of the pixels. This drawing is aligned with FIGS. 5 and 6 to show the interrelationship between these states and the values therein.

FIG. 5 shows graphs of E-bar and Intensity for the mask of FIG. 4 for a conventional, prior art binary mask which produces low contrast since intensity is too high when the mask is in the OFF state and is positive for either the A: 0° or B: 180° states of operation.

FIG. 6 shows graphs of E-bar and Intensity for the mask of FIG. 4 for a phase-shifting mask in accordance with this invention which produces good contrast since intensity is nearly zero when the mask is in the OFF state, is positive for the A: 0° state of operation and negative for the B: 180° state of operation. As can be seen the intensity is nearly zero in the OFF stage C which is the reason that the intensity is nearly zero in that state.

FIG. 7 shows a chart for another phase-shifting mask with A: 0°, B: 180°, and C: OFF states of operation associated with the conventional phase-shift masks in FIGS. 8A and 8B.

FIG. 8A shows a conventional prior art phase-shift mask PSM composed of a quartz substrate 80 with phase-shifters SH between chromium conductors CR which have been added to produce phase-shifting.

FIG. 8B shows a modified prior art phase-shift mask PSM' composed of a quartz substrate 80' with phase etching holes EH etched to a certain depth in the quartz between the chromium conductors CR to produce the desired phase-shifting as a substitute for the phase-shifters of FIG. 8A.

It is very difficult to fabricate the conventional PSM masks PSM and PSM' of FIGS. 8A and 8B without defects and with correct phase characteristics.

In accordance with this invention, an erasable, electronically controlled phase pixel mask matrix mask is provided.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A dynamic mask exposure system comprising:
   a support for a workpiece,
   a source of a beam of exposure radiation,
   a transmissive dynamically changing, phase-shifting (TDCPS) mask comprising a spatial light modulator (SLM) with orthogonally arranged matrices of actuator lines and binary pixel units which are opaque or transparent as a function of control inputs from a control system to the actuator lines, the TDCPS mask having a top surface and a bottom surface,
   supply means for supplying pixel control signals to the actuator lines of the TDCPS mask to form a pattern of transparent regions and opaque regions,
   a control system connected to supply pixel control signals to the actuator lines of the TDCPS mask to form a pattern of transparent regions and opaque regions,
   directing means for directing the beam from the source down onto the top surface of the TDCPS mask,
   an image detection element for detecting a pattern of radiation projected thereon from the SLM, the image detection element being located on the top surface of the support,
   the beam passing from the top surface of the TDCPS mask through the transparent regions and thereby projecting a pattern from the TDCPS mask onto the support where the workpiece is to be located,
   signal means for providing signals representing a pattern projected onto the image detection element from the TDCPS mask back to the control system by connections from the image detection element to the control system, and
   the control system comparing the detected pattern data to the patterning data in the data base.

2. The system of claim 1 wherein the control system comprises a computer and a direct access storage device for storing patterning data.

3. The system of claim 1 wherein the source of the beam of exposure radiation comprises a collimated light beam.

4. The system of claim 1 wherein the source of the beam of exposure radiation comprises a collimated light beam provided by at least one condenser lens projecting the collimated light beam onto the top surface of the TDCPS mask.

5. The system of claim 1 wherein:
   the source of the beam of exposure radiation comprises a collimated light beam provided by a condenser lens projecting the collimated light beam onto the top surface of the TDCPS mask, and
   a projection lens system projecting and focusing the pattern onto the support from the bottom surface of the TDCPS mask.

6. A dynamic mask exposure system comprising:
   a workpiece support,
   a source of a beam of exposure radiation,
   a transmissive, dynamically changing, phase-shifting (TDCPS) mask with orthogonally arranged matrices of actuator lines and binary pixel units which are opaque or transparent as a function of control inputs to the actuator lines, the transmissive dynamic mask having a top surface and a bottom surface,
   a control system connected to supply pixel control signals to the actuator lines of the TDCPS mask to form a pattern of transparent regions and opaque regions with the control signals being supplied by a computer system form a data base patterning data,
   directing means for directing the beam down onto the top surface of the TDCPS mask,
   an image detection element for detecting a pattern of radiation projected thereon located on the top surface of the workpiece support, with the beam passing through the transparent regions of the TDCPS mask and projecting a pattern from the TDCPS mask onto the workpiece support where the image detection element is located,
   means for providing signals representing the pattern to the computer system, and
   the computer system providing a comparison of the detected pattern data to the patterning data in the data base.

7. The system of claim 6 wherein the control system comprises a computer and a direct access storage device for storing patterning data.

8. The system of claim 6 wherein the transmissive dynamic mask comprises a transmissive spatial light modulator (SLM).

9. The system of claim 6 wherein:
   the control system comprises a computer and a direct access storage device for storing patterning data, and
   the transmissive dynamic mask comprises a transmissive spatial light modulator.

10. The system of claim 6 wherein the source of the beam of exposure radiation comprises a collimated light beam.

11. The system of claim 6 wherein the source of the beam of exposure radiation comprises a collimated light beam provided by at least one condenser lens projecting the collimated light beam onto the top surface of the mask.

12. The system of claim 6 wherein:
   the control system comprises a computer and a direct access storage device for storing patterning data, and
   the transmissive dynamic mask comprises a transmissive spatial light modulator.

13. The system of claim 6 wherein:
   the source of the beam of exposure radiation comprises a collimated light beam provided by a condenser lens projecting the collimated beam of light onto the top surface of the mask, and
   a projection lens system is provided for projecting and focusing the pattern from the mask onto the support from the bottom surface of the mask.

14. The system of claim 13 wherein:
   the control system comprises a computer and a direct access storage device for storing patterning data, and
   the transmissive dynamic mask comprises a transmissive spatial light modulator.

15. A dynamic mask exposure system comprising:
   a workpiece support,
   a beam of exposure radiation,
   a transmissive dynamically changing, phase-shifting (TDCPS) mask with orthogonally arranged matrices of actuator lines and binary pixel units which are opaque or transparent as a function of control inputs to the actuator lines, the transmissive dynamic mask having a top surface and a bottom surface, supply means for supplying pixel control signals to the actuator lines of the TDCPS mask to form a pattern of transparent regions and opaque regions, with the control signals being supplied by a computer system from a data base of patterning data, directing means for directing the beam of exposure radiation down onto the top surface of the TDCPS mask, and through the transparent regions of the mask and to project a pattern through the TDCPS mask onto the workpiece support, detection means for detecting the pattern projected onto the workpiece support and producing detected pattern data in response to the pattern projected onto the workpiece support, transmission means for sending the detected pattern data to the computer system, and comparison means for comparing the detected pattern data to the patterning data in the data base with the computer system.

16. The system of claim 15 wherein the computer corrects the CD variations and distortion in the detected pattern data.

17. The system of claim 15 wherein the TDCPS mask comprises a transmissive spatial light modulator (SLM).

18. The system of claim 15 wherein:
the computer to corrects the CD variations and distortion in the detected pattern data, and
the TDCPS mask comprises a transmissive spatial light modulator (SLM).

19. The system of claim 15 wherein the beam comprises a collimated light beam.

20. The system of claim 15 wherein the beam comprises a collimated light beam provided by a condenser lens projecting the collimated beam of light onto the top surface of the TDCPS mask.

21. The system of claim 20 wherein:
the system includes using the computer to correct the CD variations and distortion in the detected pattern data, and
the TDCPS mask comprises a transmissive spatial light modulator (SLM).

22. The system of claim 15 wherein:
the beam comprises a collimated light beam provided by a condenser lens projecting the collimated light beam onto the top surface of the mask, and
a projection lens system projecting and focusing the pattern from the mask onto the support from the bottom surface of the TDCPS mask.

23. The system of claim 22 wherein:
the computer corrects the CD variations and distortion in the detected pattern data, and
the TDCPS mask comprises a transmissive spatial light modulator (SLM).

24. A dynamic mask exposure system comprising:
a workpiece support,
a beam of exposure radiation,
a transmissive dynamically changing, phase-shifting (TDCPS) mask with orthogonally arranged matrices of actuator lines and binary pixel units which are opaque or transparent as a function of control inputs to the actuator lines, the TDCPS mask having a top surface and a bottom surface, supply means for supplying pixel control signals to the actuator lines of the transmissive dynamic mask to form a pattern of transparent regions and opaque regions, the pixel control signals being produced by a computer which includes a data storage device which stores data base patterns, directing means for directing the beam of exposure radiation down onto the top surface of the TDCPS mask, an image detection element for detecting a pattern of radiation located on the top surface of the workpiece support, the image detecting element detecting portions of the beam passing through the transparent regions and projection means for projecting a pattern from the TDCPS mask onto the workpiece support where the image detection element is located, pattern data means for producing detected pattern data from the image detection element in response to the pattern projected from the TDCPS mask onto the image detection element, signal means for producing signals representing the detected pattern data to the control system from the image detection element, and comparison means for comparing the signals representing the detected pattern data to data base patterns.

25. The system of claim 24 wherein the computer is used to correct the CD variations and distortion in the detected pattern data.

26. The system of claim 24 wherein the TDCPS mask comprises a transmissive spatial light modulator.

27. The system of claim 24 wherein:
the computer corrects the CD variations and distortion in the detected pattern data, and
the TDCPS mask comprises a transmissive spatial light modulator.

28. The system of claim 24 wherein the beam comprises a collimated light beam.

29. The system of claim 24 wherein the beam comprises a collimated light beam provided by a condenser lens projecting the collimated beam of light onto the top surface of the TDCPS mask.

30. The system of claim 29 wherein:
the computer corrects the CD variations and distortion in the detected pattern data, and
the TDCPS mask comprises a transmissive spatial light modulator.

31. The system of claim 24 wherein:
the beam comprises a collimated light beam provided by a condenser lens projecting the collimated light beam onto the top surface of the TDCPS mask, and
a projection lens system projects and focuses the pattern from the TDCPS mask onto the support from the bottom surface of the TDCPS mask.

32. The system of claim 31 wherein:
the computer corrects the CD variations and distortion in the detected pattern data, and
the TDCPS mask comprises a transmissive spatial light modulator.

* * * * *